(12) United States Patent
Goetz et al.

(10) Patent No.: US 6,492,847 B1
(45) Date of Patent: Dec. 10, 2002

(54) DIGITAL DRIVER CIRCUIT

(75) Inventors: Laszlo Goetz, Freising (DE); Stefan Reithmaier, Freising (DE); Martin Rommel, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 09/689,078

(22) Filed: Oct. 12, 2000

(30) Foreign Application Priority Data

Oct. 12, 1999 (DE) .......................................... 199 49 144

(51) Int. Cl.[7] ................................................. H03B 1/00
(52) U.S. Cl. ......................... 327/112; 327/264; 327/285; 327/310; 326/27; 326/83; 307/412
(58) Field of Search ................. 327/108–112, 261–264, 327/271, 272, 284, 285, 309–310, 313, 333; 326/26, 27, 82–87; 307/412; 365/230.08, 189.11

(56) References Cited

U.S. PATENT DOCUMENTS

| | | | | |
|---|---|---|---|---|
| 4,482,826 A | * | 11/1984 | Ems et al. .................. 327/270 |
| 4,825,420 A | * | 4/1989 | Min ....................... 365/230.08 |
| 5,117,131 A | * | 5/1992 | Ochi et al. ..................... 326/71 |
| 6,204,710 B1 | * | 3/2001 | Goetting et al. ............ 327/276 |

* cited by examiner

Primary Examiner—Timothy P. Callahan
Assistant Examiner—Minh Nguyen
(74) Attorney, Agent, or Firm—Pedro P. Hernandez; W. James Brady, III; Frederick J. Telecky, Jr.

(57) ABSTRACT

A digital driver circuit with one or more CMOS inverters intended as input stages, whereby for the MOS FETs of the inverters the channel width/length (W/L) ratio increases from stage to stage. The digital driver circuit includes an intermediate stage with two further CMOS inverters, connected between a supply voltage Vcc and ground. The driver circuit also includes an output stage having two MOS FETs with the drain terminals of both the MOS FETs of the output stage connected both to each other and to the output of the circuit, the W/L ratio of both MOS FETs exceeding that of the MOS FETs of the intermediate stage. The switch-over of the two MOS FETs of the output stage, occurring with changes of the digital input signal at the input of the circuit, is offset in time with respect to each other, thereby reducing current peaks.

7 Claims, 2 Drawing Sheets

DIGITAL DRIVER CIRCUIT

The invention in general relates to a digital driver circuit, and in particular to a digital driver circuit which uses CMOS inverters.

Digital driver circuits are used in integrated circuits to recharge relatively large capacitance values, such as occur, for example, in connection with the feed-in of data and clock pulses. The driver circuits thereby adapt small capacitive loads to large capacitive loads, whilst optimising delay times. A further criterion for optimising digital driver circuits constitutes the amount of chip surface required. Examples of digital driver circuits include output driver circuits, part of which are bus drivers.

In order to reduce the delay times caused by the re-charging process, which can have a negative influence on the overall speed of a digital system, a particularly simple digital driver circuit has been proposed, which consists of a chain of CMOS inverters, where the relation of channel width (W) to channel length (L) (from here on referred to as W/L ratio, for simplicity), of the MOS FETs composing the CMOS inverters increases from chain unit to chain unit. Huang Chang Lin and Loren W. Linholm describe such a digital driver circuit in their article óAn Optimised Output Stage for MOS Integrated Circuitsöin the IEEE Journal of Solid State Circuits, Vol. SC-10, No. 2, April 1975. The degree of change of the W/L ratio between the individual chain units is chosen to suit specific applications, so as to minimise the delay times caused by the re-charging processes.

FIG. 1 shows such a digital driver circuit with inverting functions, as known in accordance with contemporary technology, which consists of three successive CMOS inverters where the source of each p-channel MOS FET is connected to the supply voltage and the source of each n-channel MOS FET is connected to ground. If a digital input signal of voltage Ue, which may take the states of 0 V or Vcc, is applied to input 1 of the circuit, this appears as an inverted digital output signal of voltage Ua at the output 2 of the circuit. As illustrated in FIG. 2, the W/L ratios of the p-channel MOS FETs of the individual stages, from input 1 of the circuit to output 2 of the circuit, increase from 20/1 to 200/1 and then to 800/1, and those of the n-channel MOS FETs increase from 10/1 to 100/1 and finally to 400/1.

When in a non-active state, that is when the digital input signal Ue of the circuit is in either the H or L state, the energy consumption of the circuit is very low, since in each CMOS inverter one MOS FET is in the OFF state, therefore preventing current to flow from the supply voltage terminal to the ground terminal. When, however, the digital input signal changes its state, that is when it changes either from the H into the L state or from the L into the H state, both MOS transistors of each of the inverter stages are switched ON during a short period while the voltage Ue changes, leading to a current peak. The largest current peak will thereby be generated by the last CMOS inverter, which is the one supplying the greatest power.

These current peaks, which for circuits designed for low power applications may be well in excess of currents normally encountered, are undesirable and may be the cause of several problems. For example, reference circuits and low-noise circuits may suffer interference from these current peaks. Furthermore, when series resistors are used as a protection against electrostatic discharges, these current peaks cause a marked voltage drop at the resistors involved.

The purpose of the invention is to provide an especially compact driver circuit of simple design, whereby the current peaks originated in conventional circuits of this type, when the digital input signal changes over, are markedly reduced. This problem is solved by a digital driver circuit comprising one or more cascading input stages, each consisting of a CMOS inverter where the source of its p-channel MOS FET is connected to the supply voltage and where the source of its n-channel MOS FET is connected to ground, whereby the ratio between channel width (w) and channel length (L) (W/L ratio) of the CMOS inverter MOS FETs increases from stage to stage by a pre-determined amount;

an intermediate stage with a first CMOS inverter, where the source of its p-channel MOS FET is connected to the supply voltage, and a second inverter where the source of its n-channel MOS FET is connected to ground, whereby the inputs of both the CMOS inverters of the intermediate stage are connected to the output of the last input stage, the source of the n-channel MOS FET of the first CMOS inverter of the intermediate stage being connected to the source of the p-channel MOS FET of the second CMOS inverter of the intermediate stage, and where the pre-determined W/L ratio of the p-channel MOS FET of the first CMOS inverter of the intermediate stage and of that of the n-channel MOS FET of the second CMOS inverter of the intermediate stage is not smaller than that of the corresponding MOS FET of the last CMOS inverter of the input stages;

a delay stage with a CMOS inverter connected between the supply voltage rail and ground, the input of which being connected o the output of the last input stage, and whose output is connected to the source of the n-channel MOS FET of the first CMOS inverter of the intermediate stage; and an output stage with a p-channel MOS FET, the gate of which is connected to the output of the first CMOS inverter of the intermediate stage, and whose source is connected to the supply rail, and an n-channel MOS FET, the gate of which is connected to the output of the second CMOS inverter of the intermediate stage, and whose source is connected to ground, whereby the drains of both MOS FETs of the output stage are connected to each other, as well as with the output of the circuit, and where the W/L ratio of the p-channel MOS FET of the output stage and the W/L ratio of the n-channel MOS FET of the output stage exceed the W/L ratio of the p-channel MOS FET of the first CMOS inverter of the intermediate stage or, respectively, the W/L ratio of the n-channel MOS FET of the second CMOS inverter of the intermediate stage by a pre-determined value;

whereby the W/L ratio of the MOS FETs of the CMOS inverter of the delay stage, in comparison with the W/L ratios of the corresponding MOS FETs of the last CMOS inverter of the input stages, the p-channel MOS FET of the first CMOS inverter of the intermediate stage, and the n-channel MOS FET of the second CMOS inverter of the intermediate stage is made so small that the switch-over of both the MOS FETs of the output stage occurring when a change of the digital input signal at the input of the circuit takes place is offset in time with respect to each other.

The digital driver stage according to the invention achieves the reduction of current peaks in that the p-channel MOS FET and the n-channel MOS FET of the output stage of the circuit switch over at different times when the digital input signal changes, so that the current flow occurring with conventional driver circuits during switch-over between the supply voltage and ground is either absent or markedly shorter and smaller than before.

Advantageous further embodiments of the invention are characterised in the sub-claims.

The invention shall now be explained by means of examples with recourse to the illustrations showing in FIG. 1 the circuit diagram of a digital driver circuit according to present-day technology;

FIG. 2 the circuit diagram of a preferred embodiment of the digital driver circuit according to the invention; and FIG. 3 graphs, which show the temporal sequence of the voltage jumps occurring at the individual circuit points of the circuit represented in FIG. 2 when the digital input signal to the circuit switches over.

Figure 1:
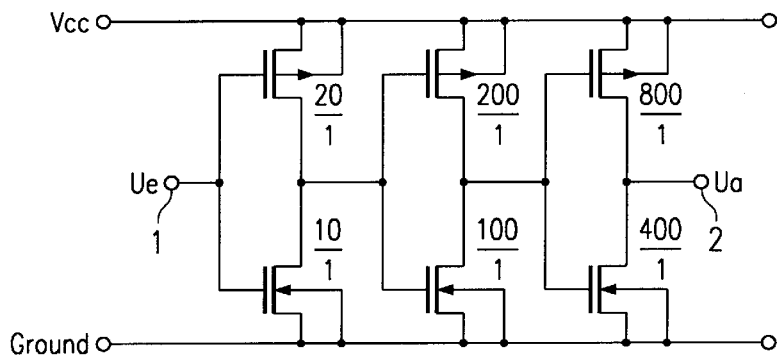
FIG. 1 shows a digital driver circuit according to present day technology which is explained in the introduction to the description.
Figure 2:
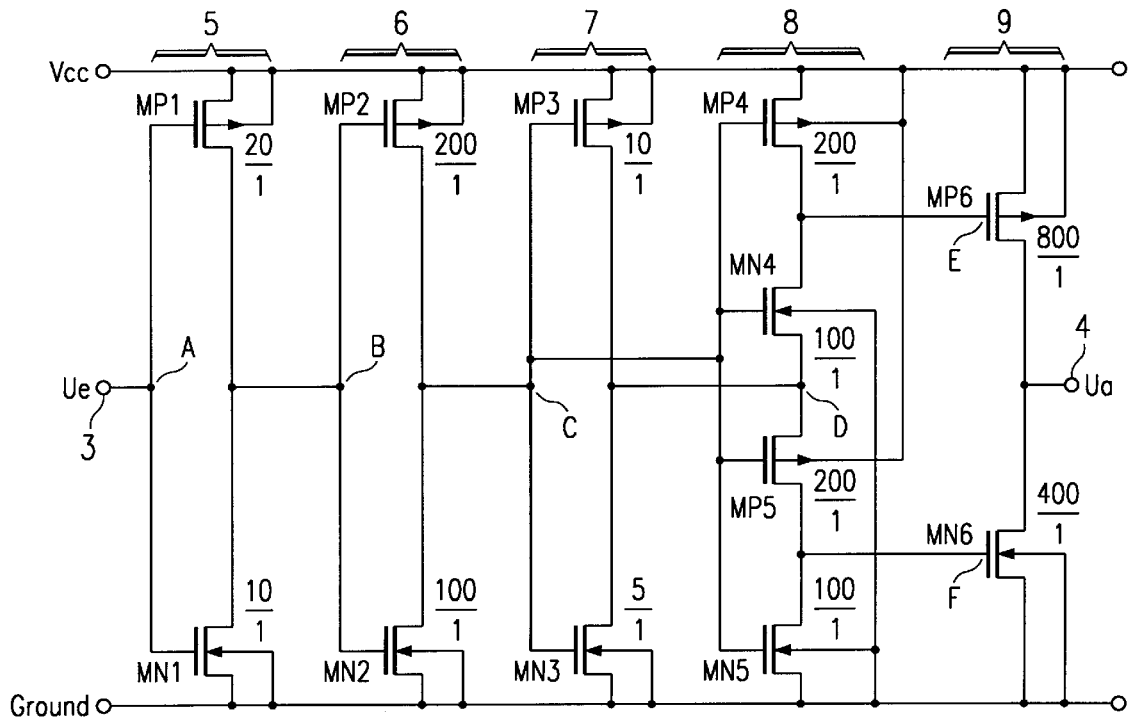
FIG. 2 shows a preferred embodiment of a digital driver circuit according to the invention.

The driver circuit illustrated in FIG. 2 comprises two input stages 5 and 6 which consist of a CMOS inverter in each case. The input A of the first input stage 5 is connected to the input 3 of the digital driver circuit, to which is applied a digital input signal of voltage Ue which may assume the static digital states of Vcc (H state) and 0 V (Ground, L state).

The CMOS inverter MP1, MN1 of the first input stage 5 comprises a p-channel MOS FET MP1, the gate of which is connected to the input 3 of the driver circuit, the source to the supply voltage Vcc, the drain to the output of the CMOS inverter MP1, MN1 of the first input stage 5, and the substrate is connected to the supply voltage Vcc, and an n-channel MOS FET MN1, the gate of which is connected to the input 3 of the driver circuit, the source to ground, the drain to the output of the CMOS inverter MP1, MN1 of the first input stage 5, and the substrate is connected to ground.

The W/L ratio of the p-channel MOS FET MP1 is 20:1, that of the n-channel MOS FET MN1 is 10:1. The W/L ratio of the p-channel MOS FET MP1 is, as is normal for CMOS inverters, greater than that of the n-channel MOS FET MN1, in order to compensate for the reduced charge carrier mobility in the p-channel MOS FET MP1, so as to produce a symmetrical signal-to-noise ratio for the digital input signals of the driver circuit to the breakover points of the CMOS inverter. In order to achieve this effect it is normal practice in CMOS technology to chose for the p-channel MOS FET MP1 width increase factors with respect to the width of the n-channel MOS FET MN1 which range between 2 and 4. In the case of the here described embodiment of the present invention a width increase factor of 2 is always used. The MOS FETs MP2 and MN2 of the CMOS inverter MP2, MN2 of the second input stage 6 are arranged in a circuit configuration corresponding to that of the MOS FETs MP1, MN1 of the CMOS inverter MP1, MN1 of the first input stage 5, whereby the output of the CMOS inverter MP1, MN1 of the first input stage 5 is connected to the input B of the CMOS inverter MP2, MN2 of the second input stage 6. The W/L ratios of the two MOS FETs MP2, MN2 of the CMOS inverter MP2, MN2 of the second input stage 6 are here greater by a factor of 10 than those of the CMOS inverter MP1, MN1 of the first input stage 5, so that the CMOS inverter MP2, MN2 of the second input stage 6 is capable of driving a larger capacitance than the CMOS inverter MP1, MN1 of the first input stage 5.

The output of the CMOS inverter MP2, MN2 of the second input stage 6 is connected on the one hand with the input of a CMOS inverter MP3, MN3, in the following referred to a delay stage 7, and on the other, via the input C of the delay stage 7, with the input of an intermediate stage 8, which consists of two CMOS inverters (MP4, MN4; MP5, MN5).

The first CMOS inverter MP4, MN4 of the intermediate stage consists of a p-channel MOS FET MP4, the gate of which is connected, via the input of the delay stage 7, to the output of the second input stage 6, the source to the supply voltage Vcc, the drain to the output of the first CMOS inverter MP4, MN4 of the intermediate stage 8, and the substrate to the supply voltage Vcc, and the n-channel MOS FET MN4 whose gate, via the input of the delay stage 7, is connected to the output of the second input stage 6, the source to the circuit point D, connecting the two CMOS inverters of the intermediate stage 8, the drain to the output of the first CMOS inverter MP4, MN4 of the intermediate stage, and the substrate to ground.

The second CMOS inverter MP5, MN5 of the intermediate stage 8 consists of the p-channel MOS FET MP5, of which the gate is connected to the output of the second input stage 6 via the input of the delay stage 7, the source is connected at circuit point D to the source of the n-channel MOS FET MN4 of the first CMOS inverter of the intermediate stage 8, the drain to the output of the second CMOS inverter MP5, MN5 of the intermediate stage where the substrate is connected to the supply voltage Vcc, and the n-channel MOS FET MN5, the gate of which is connected to the output of the second input stage 6 via the input of the delay stage 7, the source is connected to ground, the drain to the output of the second CMOS inverter MP5, MN5 of the intermediate stage 8, and the substrate to ground.

The W/L ratios of the MOS FETs MP4, MN4, MP5 and MN5 of the intermediate stage 8 correspond to those of the corresponding MOS FETs MP2 and MN2 of the second input stage 6 and for the p-channel MOS FET MP4, the n-channel MOSFET MN4, the p-channel MOS FET MP5 and the n-channel MOS FET MN5 are 200:1, 100:1, 200:1 and 100:1, respectively.

The MOS FETs MP3, MN3 of the delay stage 7 are connected in accordance with the MOS FETs MP1, MN1 of the CMOS inverter of the first input stage 5, whereby their W/L ratios are 10:1 and 5:1 respectively, and therefore smaller by the factor 20 than the corresponding MOS FETs of the neighbouring stages, that is those of the second input stage 6 and of the intermediate stage 8. The delay stage is therefore considerably slower in recharging the capacitive output loads than both its neighbouring stages. The output of the CMOS inverter MP3, MN3 of the delay stage 7 is connected to the circuit point D, joining the first CMOS inverter MP4, MN4 of the intermediate stage to the second CMOS inverter MP5, MN5 of the intermediate stage. The precise function of the delay stage 7 will be explained in detail below. Finally, the driver circuit illustrated in FIG. 2 comprises an output stage 9 consisting of a p-channel MOS FET MP6, the gate E being connected to the output of the first CMOS inverter MP4, MN4 of the intermediate stage 8, the source to the supply voltage Vcc, the drain to the output of the output stage 9 and to the output 4 of the driver circuit, respectively, and its substrate being connected to the supply voltage Vcc, and an n-channel MOS FET MN6, the gate F of which being connected to the output of the second CMOS inverter MP5, MN5 of the intermediate stage 8, the source to ground, the drain to the output of the output stage 9 and to the output 4 of the driver circuit, and the substrate being connected to ground. The W/L ratios of the p-channel MOS FET MP6 and that of the n-channel MOS FET MN6 of the output stage 9 are 800:1 and 400:1 respectively, and are therefore considerably greater than those of the preceding stages. This means that the output stage 9 has the largest current control capability of the circuit.

At the output 4 of the digital driver circuit appears the digital output voltage signal Ua which may also assume the values Vcc and 0 volts (ground). Since the digital driver circuit is non-inverting, the signal pattern of the output signal Ua follows that of the input signal Ue.

In the following, the function of the digital driver circuit according to the invention, as illustrated in FIG. 2, shall be explained with reference to FIGS. 2 and 3.

Particular attention shall thereby be given to the signals present at the following circuit points, as marked in FIG. 2:
  A. Input of the CMOS inverter MP1, MN1 of the first input stage S,
  B. input of the CMOS inverter MP2, MN2 of the second input stage 6,
  C. input of the CMOS inverter MP3, MN3 of the delay stage 7,
  D. joining point, connected to the output of the CMOS inverter MP3, MN3 of the delay stage 7, between the source connections of the n-channel MOS FET MN4 of the first CMOS inverter MP4, MN4 of the intermediate stage 8, and the p-channel MOS FET MP5 of the second CMOS inverter MP5, MN5 of the intermediate stage 8,
  E. gate connection of the p-channel MOS FET MP6 of the output stage 9,
  F. gate connection of the n-channel MOS FET MN6 of the output stage 9.

Initially, the static condition of the circuit shall be considered. If, for example, a digital signal of voltage Vcc (H state) is present at the input 3 of the driver circuit illustrated in FIG. 2,, then, because of the action of the CMOS inverter MP1, MN1 of the first input stage 5, an inverted signal of 0 V (L state) will be present at the input of the second CMOS inverter MP2, MN2 of the second input stage 6. The CMOS inverter MP2, MN2 once again inverts the signal, so that at the input C of the CMOS inverter MP3, MN3 of the delay stage 7, and at the inputs of both CMOS inverters MP4, MN4 and MP5, MN5 of the intermediate stage 8 a signal of voltage value Vcc (H state) is present. The delay stage 7, the proper function of which will become clear later on in connection with the explanation of the dynamic behaviour of the driver circuit, inverts this signal and thereby re-charges the circuit point D to the voltage 0 V (ground). By the action of the two CMOS inverters MP4, MN4 and MP5, MN5 of the intermediate stage 8, a signal of voltage 0 V (L state) is now produced at the gates E and F, respectively, of both MOS FETs of the output stage. The p-channel MOS FET MP6 will therefore be turned on and the n-channel MOS FET MN6 will be turned off, so that a signal of voltage Vcc (H state) will be present at output 4 of the driver circuit. The circuit as a whole therefore acts as a non-inverting unit. The driver circuit behaves in an analogue fashion when a static signal of 0 V (L state) is applied to its input. In its non-active state, the energy consumption of the circuit is minimal, since no current paths exist between the supply voltage rail and ground.

In the following, the dynamic behaviour of the driver circuit illustrated in FIG. 2 will be explained. In this context, particular reference will be made to FIG. 3, where the states of the above-mentioned circuit points A, B, C, D, E and F are represented.

Figure 3:
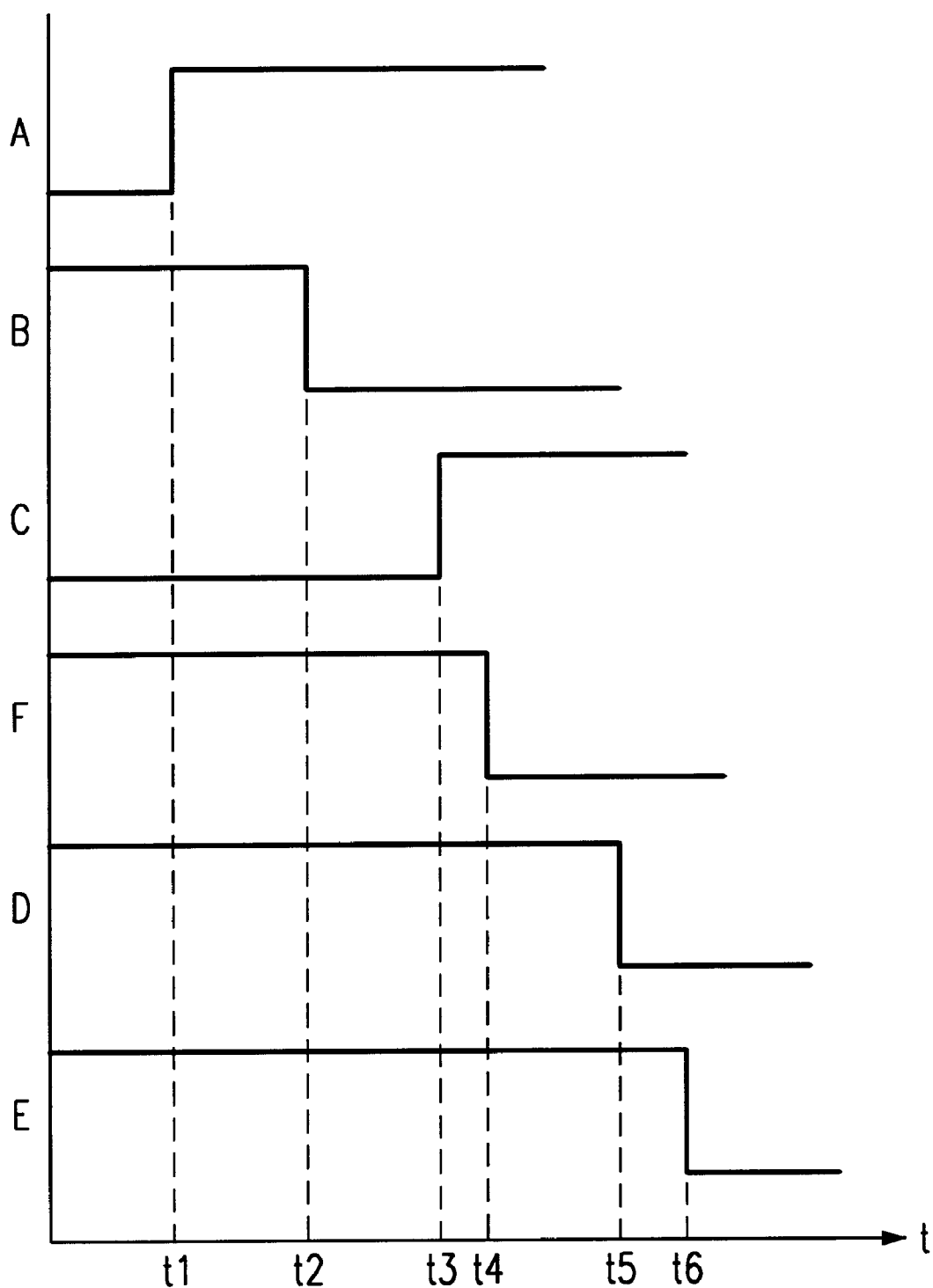

FIG. 3 represents the case where the digital input signal Ue present at the input 3 of the driver circuit is switched over from 0 V (L state) to Vcc (H state).

At the point in time t1, represented at the bottom of FIG. 3, the signal Ue, present at the input of the CMOS inverter MP1, MN1 of the first input stage 5, is switched over to Vcc (H state). The CMOS inverter MP1, MN1 inverts this signal with a certain delay caused by the re-charging process, so that the signal present at the circuit point B, the input of the CMOS inverter MP2, MN2 of the second input stage 6, is switched over to 0 V (L state) at the point in time t2. The CMOS inverter MP2, MN2 of the second input stage 6 once again inverts this signal, so that after another delay interval, at the point in time t3, the signal at input C of the CMOS inverter MP3, MN3 of the delay stage 7 and at the inputs, connected to it, of both the CMOS inverters MP4, MN4 and MP5, MN5 of the intermediate stage 8, is switched over from 0 V (L state) to Vcc (H state).

Now that the W/L ratios of the mutually corresponding MOS FETS of the second input stage 6 and that of the intermediate stage 8 are equalised and thereby enabling a relatively fast re-charging speed, the n-channel MOS FET MN5 of the second CMOS inverter MP5, MNS attains in a relatively short time span its gate-source voltage Vcc, exceeding its positive threshold voltage, so that it changes from the off state to the on state. The p-channel MOS FET MP5 of the second CMOS inverter MPS, MN5 goes into the off state at the same time, since its gate-source voltage immediately drops to zero, whereby it then slowly drifts into the positive range during the slow re-charging process at the circuit point D, connected to the source of the p-channel MOS FET MP5, due to the low W/L ratio of the MOS FETs of the CMOS inverter of the delay stage 7, which, however, does no longer change the condition of the p-channel MOS FET MPS. The second CMOS inverter MP5, MN5 therefore switches over and charges the gate capacity of the n-channel MOS FET MN6 of the output stage 9, connected to the output of the second CNOS inverter MP5, MN5, the gate F of which will then be at a voltage of 0 V at the point in time t4. The gate-source voltage of the n-channel MOS FET now drops to 0 V and goes below the threshold voltage of the transistor, whereupon this transistor goes into the off state.

Since the circuit point D, at the point in time t4 and because of the slow re-charging speed of the CMOS inverter MP3, MN3 of the delay stage 7, is not completely re-charged to 0 V and is as yet near Vcc, the gate-source voltage of the n-channel MOS FET MN4 does not yet exceed the threshold voltage required for switching into the on state at this time. Only at the point in time t5, the circuit point D has been re-charged to the extent that the threshold voltage is reached and the transistor MP4 goes into the on state. At this point in time, the transistor MP4 is off, so that the CMOS inverter MP4, MN4 re-charges the gate capacity of the p-channel MOS FET MP6, whereby at the point in time t6, the gate terminal E of the p-channel MOS FET MP6 of the output stage 9 reaches a potential of 0 V, whereupon this transistor goes into the off state, and the voltage at output 4 of the driver circuit increases from 0 V (L state) to Vcc (H state).

The switch-over of MOS FETs MP6, MN6, which carry the heaviest current in the output stage, therefore takes place at a temporal offset against each other by the difference between t6 and t4, whereby large current peaks at the output of the driver circuit are prevented, since any current paths between the supply voltage rail Vcc and ground are only of very low magnitude or even non-existent. The fact that the output 4 of the driver circuit goes into a high impedance state for a short space of time can be tolerated in many applications.

The switch-over of the digital input signal Ue from Vcc (H state) to 0 V (L state) is analogue to the switch-over described from 0 V (L state) to Vcc (H state), with the difference that here the p-channel MOS FET MP6 switches over in the first place, whereby it will go into the off state, whilst the n-channel MOS FET MN6 will switch over later in time, whereby it will go into the on state.

Of particular advantage of the digital driver circuit according to the invention is the fact that the addition of the delay stage only requires an extremely small increase in chip space, because of the low W/L ratios of the MOS FETs of the delay stage 7.

The driver circuit according to the invention is of interest in particular for relatively slow applications at low frequencies, since it is then when it is most effective in the reduction of output current peaks.

Decisive for the proper function of the delay stage 7 is that, by the selection of the W/L ratio of its MOS FETs MP3 and MN3, it is dimensioned in such a way that its re-charging speed in relation to that of the neighbouring stages, that is the last stage 6 of the input stages 5 and 6, and the intermediate stage 8, is so small that a temporal offset of the switching-over process of the MOS FETs MP6 and MN6 of the output stage 9 is assured.

To the expert it is obvious that the essence of the invention does not depend on the number of CMOS inverters that are used in the input stage. Furthermore, the circuit in accordance with the invention can, of course, and in departure from the embodiment illustrated, also be made inverting.

In a similar manner, the W/L ratios given here can only be seen in the way of examples, and are to be selected individually depending on the required application (delay time, capacitance ratio between input and output of the driver, chip surface). Between the individual inverters of the input stages, a scaling-up factor of between 3 and 10 will thereby be appropriate in each case.

There is, of course, no reason why the W/L ratios of the MOS FETs MP4, MN4, MP5 and MN5 should not be chosen differently from those of the embodiment example previously described and illustrated in FIG. 2. The W/L ratios of the p-channel MOS FET MP4 of the first CMOS inverter (MP4, MN4) of the intermediate stage and that of the n-channel MOS FET MN5 of the second CMOS inverter (MP5, MN5) of the intermediate stage thereby will not fall below the W/L ratios of the corresponding MOS FETs of the CMOS inverter of the last input stage (in FIG. 2 MP2 or MN2 respectively) in order not to interrupt the driver capability, ascending, or at least remaining at a level, from stage to stage in the driver circuit. MP4 and MNS can, of course also have greater W/L ratios than the corresponding MOS FETs of the last input stage. The W/L ratio of the second n-channel MOS FET MN4 of the first CMOS inverter of the intermediate stage and the W/L ratio of the first p-channel MOS FET MP5 of the intermediate stage may, however, also be materially smaller than the W/L ratios of the corresponding MOS FETs of the CMOS inverter of the last input stage. This means that MN4 and MP5 will then assist the delay action of the delay stage by delaying the setting of their changing gate/source voltages when the digital input signal switches over. The W/L ratios of MN4 and MP5 in FIG. 2 can, therefore also be, for example, 10:1 and 5:1, whereby a further saving of chip surface as compared with the embodiment illustrated in FIG. 2 could be realised. This would even increase the temporal offset of the switch-over of both the MOS FETs of the output stage with respect to one another.

The digital driver circuit according to the invention is particularly suited to applications where a low noise level is desirable. It is furthermore also very indicated for reference circuits and for driver circuits for charge pumps.

What is claimed is:

1. Digital driver circuit having an input port for receiving a digital signal and an output port, the digital driver circuit comprising:

one or more series-connected input stages, each input stage including a CMOS inverter, each of the one or more series-connected input stages having a p-channel MOS FET and a n-channel MOS FET and the p-channel MOS FET at its source terminal is connected to a supply voltage and the n-channel MOS FET at its source terminal is connected to ground, the ratio of the channel width (W) to the channel length (L) (the W/L ratio) of the n-channel and p-channel MOS FETs from stage to stage increase by a pre-determined amount compared to the respective n-channel and p-channel MOS FETs from a previous stage;

an intermediate stage with a first CMOS inverter having a p-channel MOS FET and the p-channel MOS FET at its source terminal is connected to the supply voltage, and a second CMOS inverter having an n-channel MOS FET and the n-channel MOS FET at its source terminal is connected to ground, the inputs of both CMOS inverters of the intermediate stage are connected to the last input stage from amongst the one or more series-connected input stages, the source terminal of the n-channel MOS FET of the first CMOS inverter of the intermediate stage is connected to the source terminal of the p-channel MOS FET of the second CMOS inverter of the intermediate stage;

a delay stage with a CMOS inverter having a p-channel MOSFET and an n-channel MOS FET, the CMOS inverter is connected between the supply voltage and ground, whose input is connected to the output of the last input stage and whose output is connected to the source terminal of the n-channel MOS FET of the first CMOS inverter of the intermediate stage;

an output stage with a p-channel MOS FET whose gate terminal is connected to the output of the first CMOS inverter of the intermediate stage and whose source terminal is connected to the supply voltage, and an n-channel MOS FET whose gate terminal is connected to the output of the second CMOS inverter of the intermediate stage, and whose source terminal is connected to ground, the drain connections of both of the two MOS FETs of the output stage are connected to each other and to the output port, and the W/L ratio of the p-channel MOS FET of the output stage exceeds the W/L ratio of the p-channel MOS FET of the first CMOS inverter of the intermediate stage by a pre-determined value; and the W/L ratios of the p-channel and n-channel MOS FETs of the CMOS inverter of the delay stage are smaller, in comparison to the W/L ratios of the corresponding p-channel and n-channel MOS FETs of the last input stage, and the W/L ratio of the p-channel MOS FET of the CMOS inverter of the delay stage is smaller than the W/L ratio of the p-channel MOS FET of the first CMOS inverter of the intermediate stage and the W/L ratio of the n-channel MOS FET of the CMOS inverter of the delay stage is smaller than the W/L ratio of the n-channel MOS FET of the second CMOS inverter of the intermediate stage, such that the switch-over of the two MOS FETs of the output stage are offset against each other in time when the digital signal at the input port changes.

2. Digital driver circuit according to claim 1 wherein the W/L ratios of the p-channel MOS FET of a CMOS inverter of the input stages and that of the delay stage, in comparison with the W/L ratio of the n-channel MOS FET of the same CMOS inverter, and the W/L ratio of the p-channel MOS FET of the output stage, in comparison to the W/L ratio of the n-channel MOS FET of the output stage are greater by a factor of 2 to 4, thus creating a symmetrical noise separation between the digital input signals and the switch-over points of the CMOS inverter or the output stage, respectively.

3. Digital driver circuit according to claim 2 wherein the W/L ratios of both the p-channel and n-channel MOS FETs found in each of the input stages increase from stage to stage towards the output of the circuit by a factor of between 3 and 10.

4. Digital driver circuit according to claim 2 wherein two input stages are provided.

5. Digital driver circuit according to claim 1 wherein the W/L ratios of both the p-channel and n-channel MOS FETs found in each of the input stages increase from stage to stage towards the output of the digital driver circuit by a factor of between 3 and 10.

6. Digital driver circuit according to claim 5 wherein two input stages are provided.

7. Digital driver circuit according to claim 1 wherein two input stages are provided.

* * * * *